United States Patent
Komazaki et al.

(10) Patent No.: US 6,870,440 B2
(45) Date of Patent: Mar. 22, 2005

(54) SAW BRANCHING FILTER WITH A BRANCHING FILTER CIRCUIT FORMED ON THE PACKAGE

(75) Inventors: Tomokazu Komazaki, Tokyo (JP); Yoshiaki Fujita, Tokyo (JP); Hajime Shimamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/785,501

(22) Filed: Feb. 20, 2001

(65) Prior Publication Data

US 2001/0038322 A1 Nov. 8, 2001

Related U.S. Application Data

(62) Division of application No. 09/305,304, filed on May 5, 1999, now Pat. No. 6,222,426.

(30) Foreign Application Priority Data

Jun. 9, 1998 (JP) ............................................. 10/160088

(51) Int. Cl.[7] .............................. H03H 9/72; H03H 9/64
(52) U.S. Cl. ...................................... 333/133; 333/193
(58) Field of Search ........................ 333/133, 193–196

(56) References Cited

U.S. PATENT DOCUMENTS

| 4,910,481 | A | * | 3/1990 | Sasaki et al. ................ 333/134 |
| 5,365,209 | A | | 11/1994 | Ito et al. ..................... 333/206 |
| 5,561,406 | A | * | 10/1996 | Ikata et al. ................. 333/126 |
| 5,666,091 | A | | 9/1997 | Hikita et al. ................ 333/193 |
| 5,726,610 | A | * | 3/1998 | Allen et al. ................. 333/133 |
| 5,786,738 | A | * | 7/1998 | Ikata et al. ................. 333/133 |
| 5,864,260 | A | * | 1/1999 | Lee ............................. 333/133 |
| 5,936,483 | A | * | 8/1999 | Ikada ......................... 333/133 |
| 5,966,060 | A | * | 10/1999 | Ikada ......................... 333/193 |
| 6,057,744 | A | * | 5/2000 | Ikada ......................... 333/133 |
| 6,121,859 | A | * | 9/2000 | Takahashi ................... 333/193 |
| 6,150,900 | A | | 11/2000 | Kadota et al. .............. 333/133 |
| 6,201,457 | B1 | * | 3/2001 | Hickernell .................. 333/193 |
| 6,222,426 | B1 | * | 4/2001 | Komazaki et al. .......... 333/133 |
| 6,236,291 | B1 | | 5/2001 | Sonoda et al. ............. 333/202 |
| 6,650,205 | B2 | | 11/2003 | Goetz et al. ................ 333/193 |

FOREIGN PATENT DOCUMENTS

| JP | 5-167388 | * | 7/1993 |
| JP | 6-97761 | * | 4/1994 |
| JP | 6-350307 | * | 12/1994 |
| JP | 7-38376 | * | 2/1995 |
| JP | 9-98046 | * | 4/1997 |
| JP | 11-68512 | * | 3/1999 |
| WO | WO 98/19394 | * | 5/1998 |

OTHER PUBLICATIONS

U.S. patent application No. 09/210,746 (filed Dec. 15, 1998).
U.S. patent application No. 09/305,304 (filed May 5, 1999).

* cited by examiner

*Primary Examiner*—Barbara Summons
(74) *Attorney, Agent, or Firm*—Venable LLP; James R. Burdett; Daniel G. Vivarelli, Jr.

(57) ABSTRACT

A surface acoustic wave duplexer having an antenna terminal, a transmitting terminal and a receiving terminal. The surface acoustic wave duplexer includes a transmitting SAW filter coupled between the antenna terminal and the transmitting terminal, a receiving SAW filter coupled between the antenna terminal and the receiving terminal, a common piezoelectric substrate on which both of the transmitting SAW filter and the receiving SAW filter are formed, a package covering the common piezoelectric substrate. The antenna terminal, the transmitting terminal and the receiving terminal are formed on the package, and a frequency adjusting circuit is coupled between the antenna terminal and the transmitting SAW filter or the receiving SAW filter. The frequency adjusting circuit has a capacitance element.

13 Claims, 13 Drawing Sheets

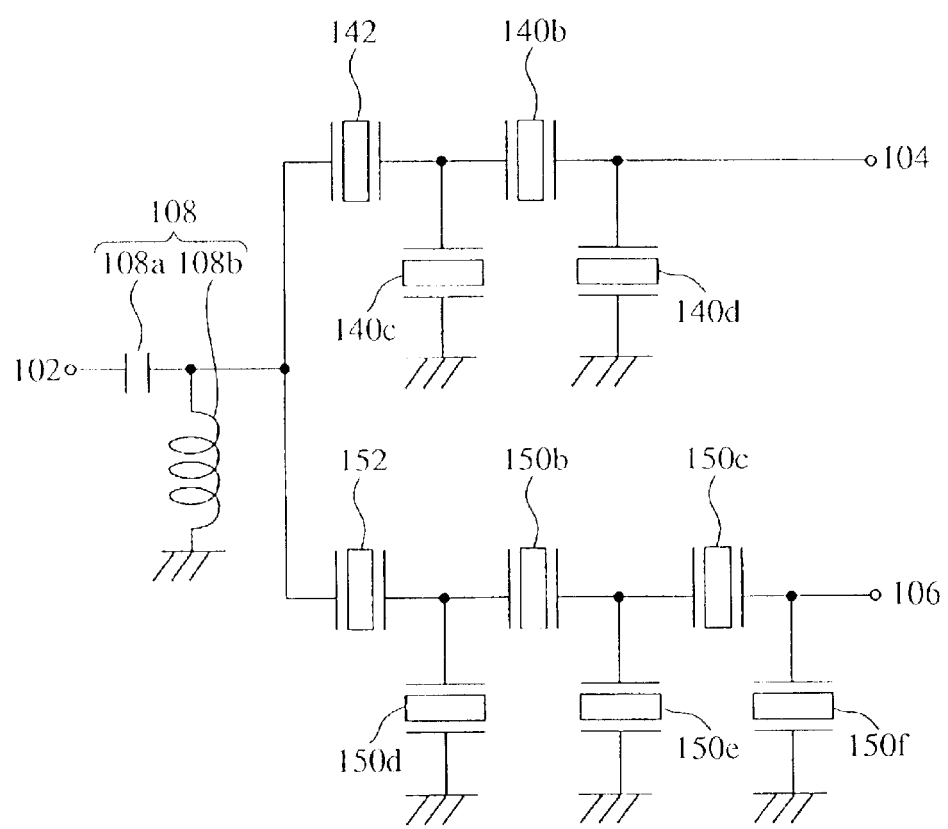

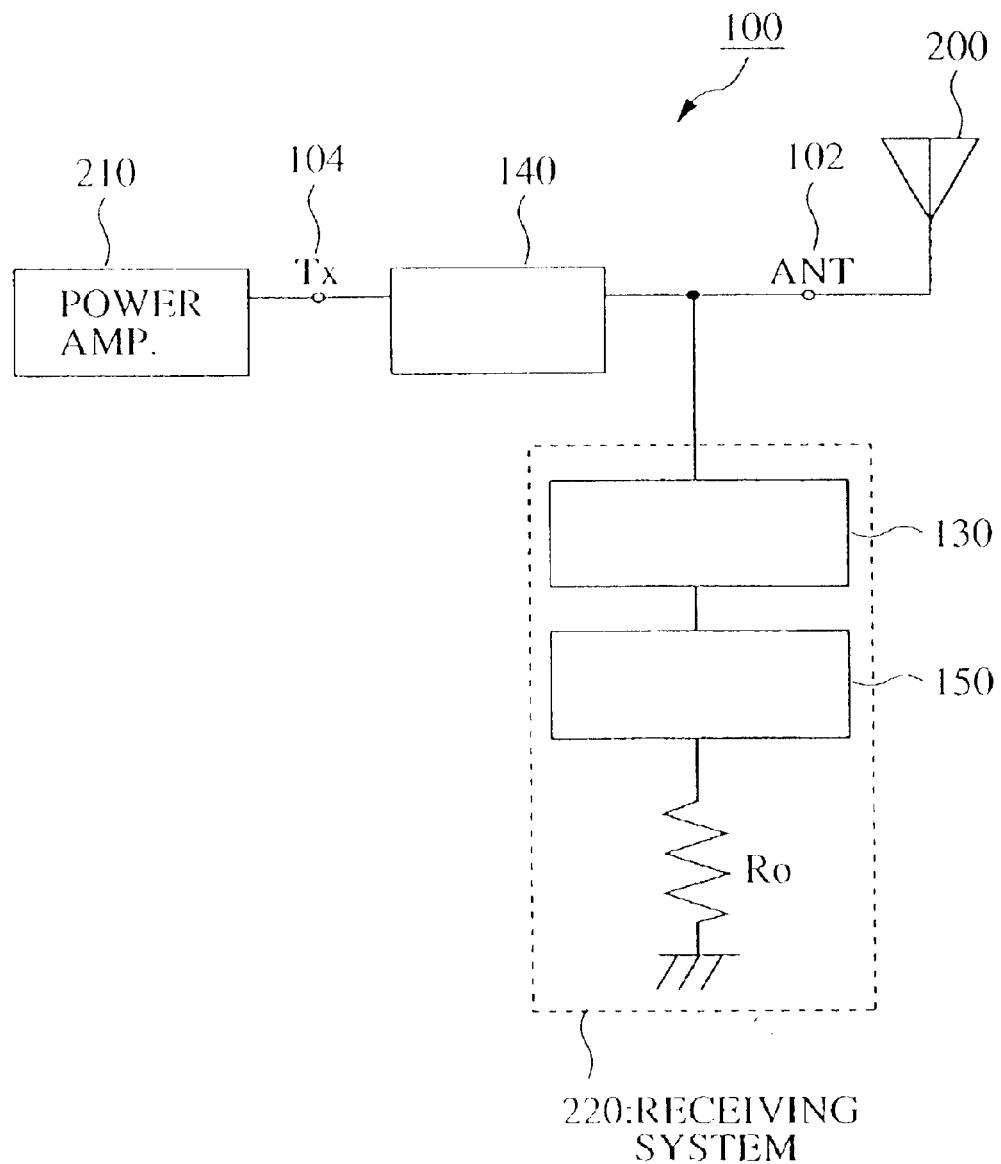

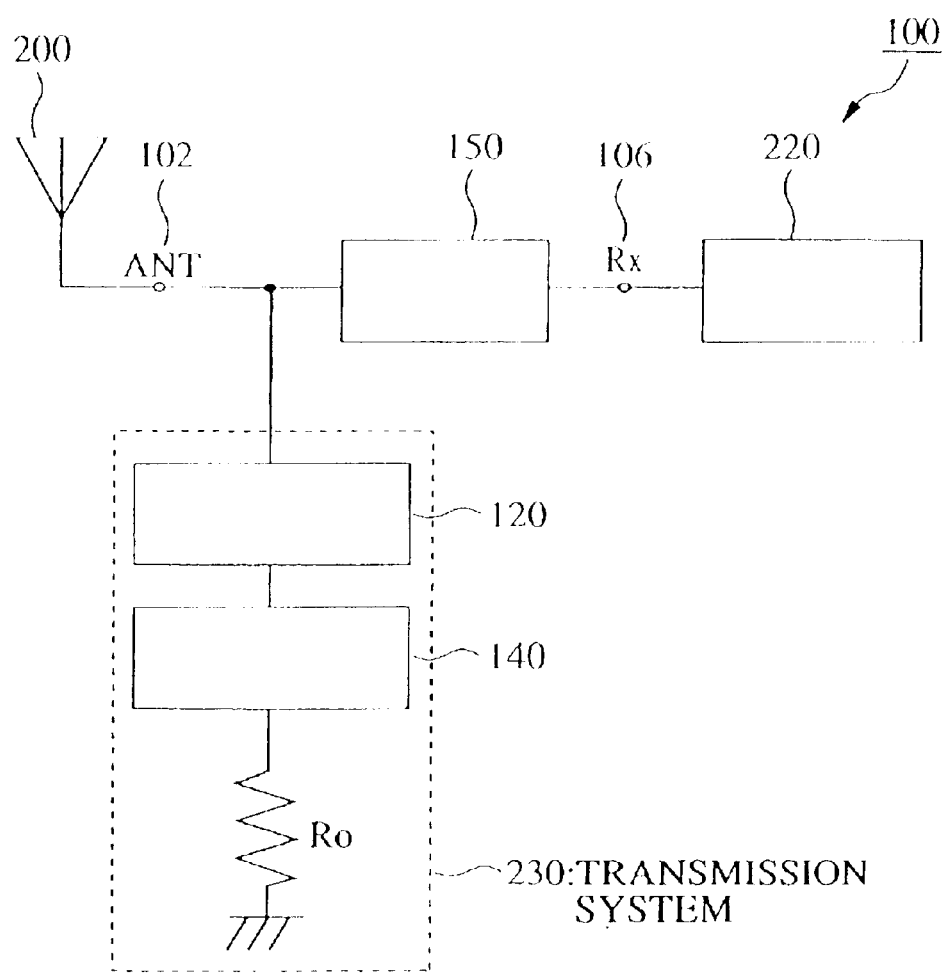

FIG. 7
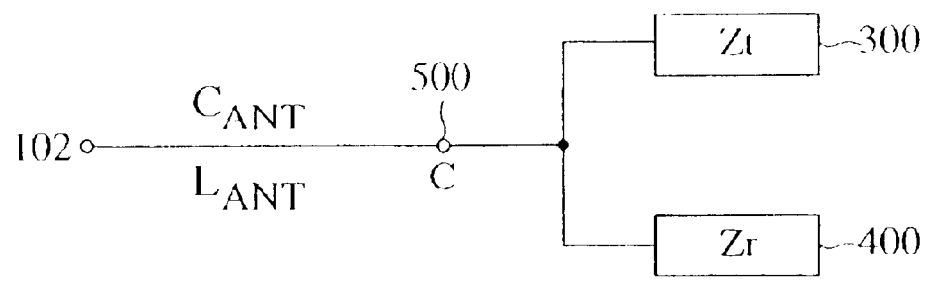
FIG. 8(A)
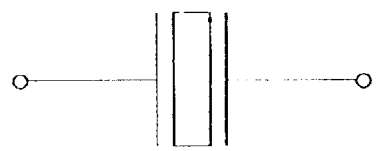
FIG. 8(B)
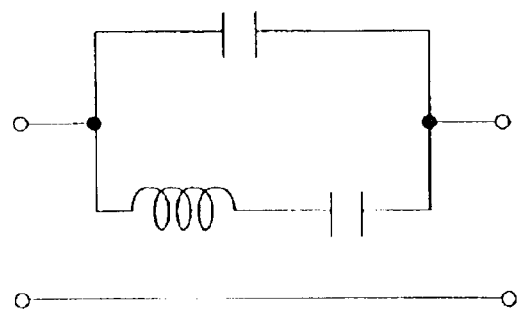

PRIOR ART

PRIOR ART

TABLE 1

| | | TS1 | | TS2 | | TS3 | | TS4 | |
|---|---|---|---|---|---|---|---|---|---|
| | | D(μm) | M | D(μm) | M | D(μm) | M | D(μm) | M |
| TRANSMISSION FILTER | | 85 | 90 | 42.5 | 90 | 84 | 86 | 60 | 60 |
| | | RxS | | RS1 | | RS2 | | RS3 | |
| | | D(μm) | M | D(μm) | M | D(μm) | M | D(μm) | M |
| RECEIVING FILTER | SERIAL ARM | 124 | 90 | 124 | 90 | 62 | 90 | 62 | 90 |
| | | | | RP1 | | RP2 | | RP3 | |
| | | | | D(μm) | M | D(μm) | M | D(μm) | M |
| | PARALLEL ARM | | | 102 | 120 | 102 | 120 | 76 | 80 |

TABLE 2

| | BRANCHING FILTER CIRCUIT FREQUENCY ADJUSTING LC ELEMENT | TRANSMISSION FILTER | | | | RECEIVING FILTER | | | |
|---|---|---|---|---|---|---|---|---|---|
| I | LT=0 (mm), LR=40 (mm) | 1.22 | 1.17 | 35.7 | 36.8 | 31.6 | 58.5 | 3.11 | 3.04 |
| II | LT=0 (mm), LR=0 (mm) | 3.56 | 3.21 | 37.9 | 28.6 | 33.0 | 55.6 | 3.11 | 2.32 |
| III | $LT_{ANT}=7$ (nH), $C_{ANT}=7$ (pF) | 1.28 | 1.28 | 36.6 | 35.0 | 34.1 | 59.0 | 3.28 | 3.20 |
| IV | $LT_{ANT}=7$ (nH) | 1.30 | 1.32 | 34.7 | 33.2 | 35.1 | 58.5 | 3.74 | 4.0 |
| V | $LT_{ANT}=10$ (nH) | 1.37 | 1.08 | 36.1 | 29.2 | 35.5 | 54.7 | 3.10 | 3.70 |

TABLE 3

| | | TRANSMISSION FILTER | | | | | RECEIVING FILTER | | | | |
|---|---|---|---|---|---|---|---|---|---|---|---|
| | FREQUENCY (MHz) | 890 | 900 | 915 | 935 | 960 | 890 | 900 | 915 | 935 | 960 |
| II | REAL NUMBER | 1.283 | 0.8627 | 1.345 | 2.313 | 0.0831 | 0.0127 | 0.0175 | 0.0320 | 0.606 | 0.7414 |
| II | IMAGINARY NUMBER | -0.816 | -0.6256 | 0.5287 | 0.8715 | -4.017 | -1.098 | -0.934 | -0.654 | -0.017 | 1.263 |
| IV | REAL NUMBER | 1.283 | 0.8627 | 1.345 | 2.313 | 0.0831 | 3.540 | 4.7507 | 0.435 | 0.875 | 0.2421 |
| IV | IMAGINARY NUMBER | -0.816 | -0.6256 | 0.5287 | 0.8715 | -4.017 | 23.20 | | | 0.0479 | 1.150 |

SAW BRANCHING FILTER WITH A BRANCHING FILTER CIRCUIT FORMED ON THE PACKAGE

This nonprovisional application is a divisional of U.S. application Ser. No. 09/305,304, filed May 5, 1999 now U.S. Pat. No. 6,222,426.

BACKGROUND OF THE INVENTION

1. Field of the Invention

The present invention relates to a branching filter that uses an surface acoustic wave (SAW) resonance type filter used for compact mobile communication equipment for portable telephones and the like.

2. Description of Related Art

In recent years, advances have been made in the development of terminals for compact, light mobile communication equipment such as portable telephones. RF (Radio Frequency) filters are incorporated into these terminals. Surface acoustic wave (SAW) resonance type filters are used for this RF filter.

Accompanying the development of these terminals is a demand for the parts to be made more compact and to have higher performance. Therefore, there is also a demand for more compact, higher performance SAW resonance filters (also called SAW elements).

FIG. 9 is a block diagram of a structural example of a conventional portable telephone branch filter.

The branch filter 10 shown in FIG. 9 comprises an antenna (ANT) terminal 11, an LC chip 12, a transmission filter 13, an Rx-branching filter circuit strip line 14, a receiving filter 15, a transmission (Tx) terminal 16, and a receiving (Rx) terminal 17. The LC chip 12 is provided between the ANT terminal 11 and ground. The transmission filter 13 is connected between ANT terminal 11 and Tx terminal 16, and the series circuit of the Rx-branching filter circuit strip line 14 and the receiving filter 15 are connected in this sequence between the ANT terminal 11 and the receiving terminal 17.

FIG. 10 is a circuit structural figure of the specific circuit structure of the branching filter shown in FIG. 9. Reference number 11 is the ANT terminal, 2, 3, and 4 are branching filter circuit strip lines (inductance) (equivalent to 14 in FIG. 9), 13 is the transmission filter, 15 is the receiving filter, 16 is the transmission (Tx) terminal, and 17 is the receiving (Rx) terminal.

Conventionally, with this type of portable telephone branching filter, the transmission and receiving filters were each composed using dielectric resonators.

FIGS. 11 and 12 show a portable telephone branching filter and mounting aspect, respectively. FIG. 11 is a schematic perspective view of the front surface, and FIG. 12 is a schematic perspective view of the back surface.

As is clear from the structural examples shown in FIGS. 11 and 12, chips 13 and 15 of the transmission and receiving filters are incorporated into on-board substrate 9. Branching filter circuit strip lines 2, 3, and 4 are provided as structural elements on this on-board substrate 9. As is also clear from FIG. 12, this on-board substrate 9 comprises an insulation substrate 9a such as a resin substrate, low temperature sinter substrate, or aluminum substrate, a metallized conductive coating pattern 9b provided thereon, and an insulation pattern 9c formed by exposing substrate 9a. Branching filter circuit strip lines 2, 3, and 4 are formed in continuum with conductive coating pattern 9b.

With this type of portable telephone branching filter, each chip of the transmission filter 13 and the receiving filter 15 is provided divided on separate piezoelectric substrates. Then, these two piezoelectric substrates are individually incorporated into one on-board substrate 9, offering the merit of excellent insulation characteristics for both filters.

However, besides the piezoelectric substrate on which are provided the chips of these transmission and receiving filters 13 and 15, an on-board substrate 9 with a space for incorporating the Rx-branching filter circuit strip line 14 and the LC chip 12 (thus, branching filter circuit strip lines 2, 3, and 4 shown in FIG. 11) is needed, so the on-board substrate becomes large, and the connecting wiring for the branching filter structure becomes long. Because of this, the structure of this on-board substrate 9 becomes complex, and the area occupied by the connecting wiring increases. This inhibits making the on-board substrate and thus the branching filter more compact.

On the other hand, a branching filter has been developed that uses a SAW resonator for the transmission filter and receiving filter (Japanese Patent Laid-open No. 6-97761). For the branching filter that uses a SAW resonance type filter disclosed in this publication, the transmission and receiving filters comprise ladder-type resonator filters with a structure similar to a serial arm SAW resonator and a parallel arm SAW resonator. With this conventional branching filter, it is possible to make the branching filter more compact to some degree, but the problem of insulation between filters has not been looked into yet. FIG. 13 is a schematic perspective view showing a structural example of the branching filter disclosed in this Japanese Patent Laid-open No. 6-97761. This branching filter has a structure with which the structural elements are incorporated into package 20. Specifically, inside a package construction 21A is provided a ground layer 21B, an impedance matching element 22, a phase adjustment element 23, a trap circuit 24, a transmission SAW filter element 25, and a receiving SAW filter element 26.

In this way, the conventional branching filter disclosed in Japanese Patent Laid-open No. 6-97761 is structured to house in a single package 20 the transmission SAW filter element 25, the receiving SAW filter element 26, an LC chip, and an Rx-branching filter circuit strip line.

However, in this case, particularly because the transmission SAW filter element 25, the receiving SAW filter element 26, the LC chip (phase adjustment element 23), and the Rx-branching filter circuit strip line (impedance matching element 22) are housed within the same package 20, there are problems including a degradation of the insulation characteristics between the transmission area and receiving area, and a degradation of the branching filter characteristics as an interaction works between the connecting wires.

SUMMARY OF THE INVENTION

Thus, an object of the present invention is to provide a branching filter that uses a SAW resonance type filter that is capable of being made more compact as well as having a higher performance level.

Another object of the present invention is to provide branching filter that uses a SAW resonance type filter with a structure with which the transmission SAW filter and receiving SAW filter can be placed in one chip.

To achieve these objects, the branching filter of the present invention comprises the unique structure described below. Specifically, the branching filter of the present invention comprises a SAW resonator. The SAW resonator comprises a transmission SAW filter linked between an antenna terminal and transmission terminal, a receiving SAW filter with different bandpass characteristics from the above-mentioned transmission SAW filter linked between the above-mentioned antenna terminal and receiving terminal, and a composite circuit of a frequency adjusting LC circuit and branching filter circuit (also called a strip line for a branching filter circuit) linked between the above-mentioned antenna terminal and the above-mentioned transmission and receiving SAW filters. Also, with the present invention, this branching filter circuit is composed from a serial arm SAW resonator. Specifically, all or part of this branching filter circuit is structured as a serial arm SAW resonator.

For a preferred embodiment of the present invention, it is desirable to have a structure, between the antenna terminal and transmission SAW filter, with a frequency adjusting LC circuit connected to the antenna terminal and a Tx-branching filter circuit strip line connected as a branching filter circuit between the above-mentioned LC circuit and transmission SAW filter for the composite circuit. It is also acceptable to have a structure with only a frequency adjusting LC circuit connected between the antenna terminal and transmission SAW filter for the composite circuit.

For a preferred embodiment of the present invention, it is desirable to have a structure, between the antenna terminal and receiving SAW filter, with the frequency adjusting LC circuit described above connected to the antenna terminal and an Rx-branching filter circuit strip line connected as a branching filter circuit between the aforementioned LC circuit and receiving SAW filter as the composite circuit.

For a preferred embodiment of the present invention, it is desirable to form a single piezoelectric substrate shared by the transmission SAW filter and receiving SAW filter.

With a preferred embodiment of the present invention, it is desirable to form a single piezoelectric shared by the transmission SAW filter, the receiving SAW filter, and the branching filter circuit.

With another preferred embodiment of the present invention, it is desirable to form a single piezoelectric substrate shared by the transmission SAW filter, the frequency characteristics adjusting LC element, the Rx-branching filter circuit strip line, and the receiving SAW filter.

With yet another preferred embodiment of the present invention, it is desirable to form a single piezoelectric substrate shared by the transmission SAW filter, the receiving SAW filter, and the branching filter circuit, and to provide a frequency adjusting LC element outside of the piezoelectric substrate.

With yet another preferred embodiment of the present invention, it is desirable to provide on the on-board substrate a piezoelectric substrate on which in some cases the transmission SAW filter and receiving SAW filter are formed together with the branching filter circuit and/or frequency adjusting LC element.

Also, for this preferred embodiment, it is desirable to form a single combined SAW resonator from a first level (stage) serial arm SAW resonator on the antenna terminal side and a serial arm SAW resonator of the branching filter circuit for both or only one of the transmission SAW filter and the receiving SAW filter.

BRIEF DESCRIPTION OF THE DRAWINGS

The foregoing and other objects, features and advantages of the present invention will be better understood from the following description taken in connection with the accompanying drawings, in which;

FIG. 3 is a circuit block diagram for explaining another specific structural example of the branching filter using a SAW resonance type filter of the present invention;

FIG. 5 is a block diagram for explaining the function of each structural element of the branching filter when the transmission operation is performed for the branching filter using a SAW resonance type filter of the present invention;

FIG. 6 is a block diagram for explaining the function of each structural element of the branching filter when the receive operation is performed for the branching filter using a SAW resonance type filter of the present invention;

FIG. 7 is a figure that provides an explanation of the impedance of the branch filter using a SAW resonance type filter of the present invention;

FIG. 8 (including FIGS. 8(A) and 8(B)) is a figure that provides an explanation of the serial arm SAW resonator and its LC equivalent circuit used for the branching filter using a SAW resonance type filter of the present invention;

DESCRIPTION OF THE PREFERRED EMBODIMENTS

Figure 1:
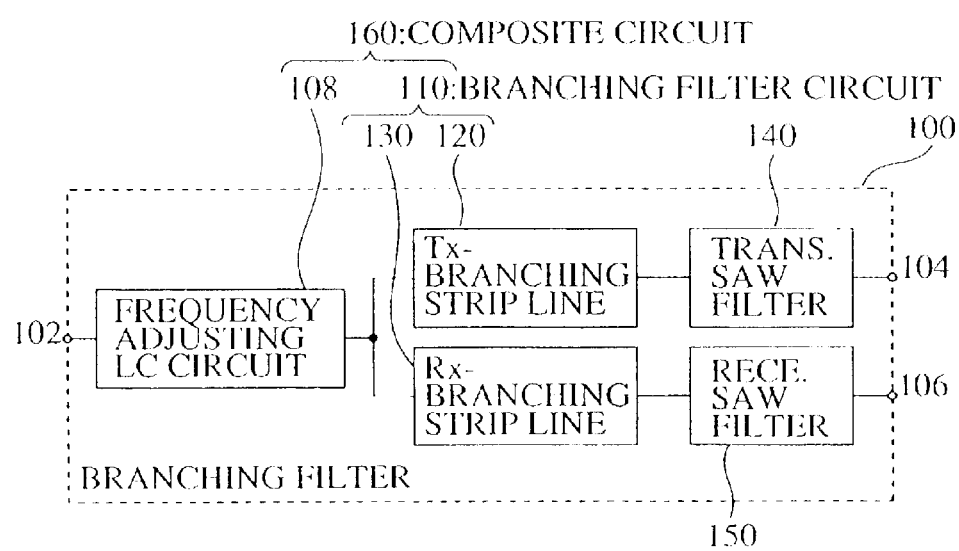
FIG. 1 is a block diagram that gives a summary explanation of a structural example of the branching filter using a SAW resonator type filter of the present invention.

With reference to the drawings, a detailed explanation will be given to preferred embodiments of the branching filter of the present invention. In the drawings, the structural elements are simply shown in summary form to make the invention easier to understand. FIG. 1 is a block diagram that schematically shows a structural example of the branching filter using a SAW resonator type filter of the present invention.

The branching filter 100 in the structural example shown in FIG. 1 comprises an antenna terminal 102, a transmission terminal 104, and a receiving terminal 106. Also, this branching filter 100 comprises a transmission SAW filter 140 linked or connected between the antenna terminal 102 and the transmission terminal 104 and a receiving SAW filter 150 linked or connected between this antenna terminal 102 and the receiving terminal 106. This transmission SAW filter 140 and receiving SAW filter 150 have different bandpass characteristics from each other. Furthermore, the branching filter 100 comprises a composite circuit 160 made from a frequency adjusting LC circuit 108 and a branching filter circuit 110 between this antenna terminal 102 and each of the transmission SAW filter 140 and the receiving SAW filter 150. These transmission and receiving SAW filters 140 and 150, the frequency adjusting LC circuit 108, and the branching filter circuit 110 form a branching filter circuit that uses a SAW resonator type filter.

Also, with the present invention, as will be described later with reference to FIGS. 2 and 3, part of this branching filter circuit 110 is constructed from a serial arm SAW resonator.

Preferably, the branching filter circuit 110 comprises a transmission side Tx-branching filter circuit strip line 120 and a receiving side Rx-branching filter circuit strip line 130. However, the Tx-branching filter circuit strip line 120 is not absolutely necessary, so it can be used as appropriate for specific designs.

Therefore, it is acceptable to construct the composite circuit 160, between the antenna terminal 102 and the transmission SAW filter 140, with the frequency adjusting LC circuit 108 connected to the antenna terminal 102 and the Tx-branching filter circuit strip line 120 connected between the aforementioned LC circuit 108 and the transmission SAW filter 140. And/or, this composite circuit 160 can be constructed only with the frequency adjusting LC circuit 108 connected between the antenna terminal 102 and the transmission SAW filter 140.

On the other hand, this composite circuit 160 is preferably constructed between the antenna terminal 102 and the receiving SAW filter 150 with the frequency adjusting LC circuit 108 described above connected to the antenna terminal 102 and the Rx-branching filter circuit strip line 130 connected between the aforementioned LC circuit 108 and the receiving SAW filter 150.

A specific example of the branching filter 100 described above will be explained with reference to FIGS. 2 and 3 in a case when the branching filter 100 comprises the Tx-branching filter circuit strip line 120 and Rx-branching filter circuit strip line 130. FIG. 2 is a circuit diagram that shows a specific structural example of the branching filter 100 using a SAW resonator of the present invention. FIG. 3 is a circuit diagram that shows another specific structural example of the branching filter 100 of the present invention.

Figure 2:
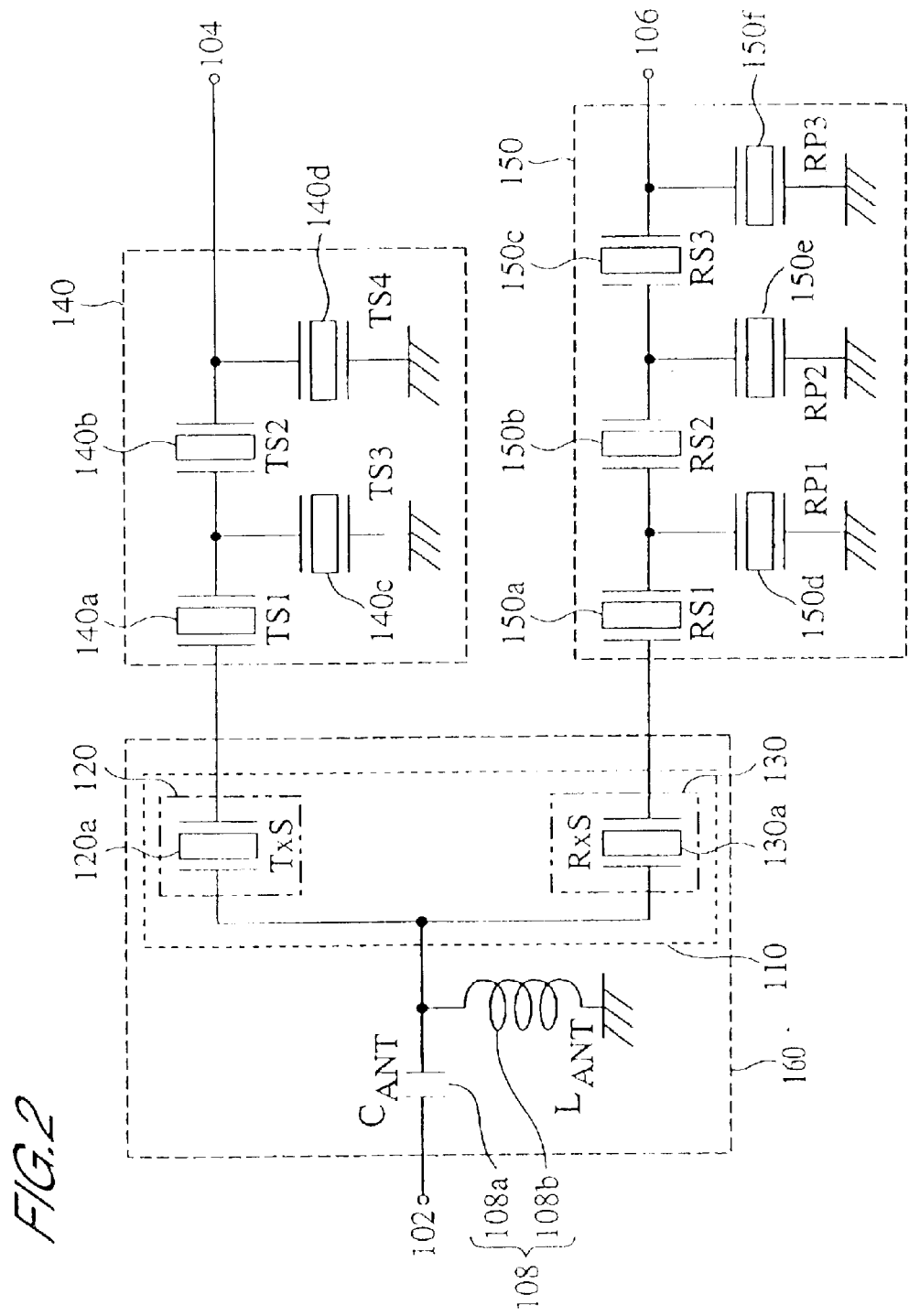
FIG. 2 is a circuit block diagram for explaining a specific structural example of the branching filter using a SAW resonator type filter of the present invention.

In the structural example shown in FIG. 2, the transmission SAW filter 140 is constructed as a ladder-type filter made from a two layer structure of a serial arm resonator and a parallel arm resonator. Specifically, the serial arm, connected between the Tx-branching filter circuit strip line 120 and the transmission terminal 104, comprises a first level (first) serial arm resonator (TS1) 140a from the Tx-branching filter circuit strip line 120 side and a second level (second) serial arm resonator (TS2) 140b. The parallel arm comprises a first layer (first) parallel arm resonator (TS3) 140c connected between the first layer and second layer serial arm resonators 140a and 140b connection points and earth and a second layer (second) parallel arm resonator (TS4) 140d connected between the transmission terminal 104 and earth.

In comparison, the receiving SAW filter 150 is constructed as a ladder-type filter made from a three layer structure serial arm resonator and parallel arm resonator. Specifically, the serial arm, connected between the Rx-branching filter circuit strip line 130 and the receiving terminal 106, comprises a first layer (first) serial arm resonator (RS1) 150a from the Rx-branching filter circuit strip line 130 side, a second layer (second) serial arm resonator (RS2) 150b, and a third layer (third) serial arm resonator (RS3) 150c. The parallel arm comprises a first layer parallel arm resonator (RP1) 150d connected between the connection point of first layer and second layer serial arm resonators 150a and 150b and earth, a second layer (second) parallel arm resonator (RP2) 150e connected between the connection point of second and third serial arm resonators 150b and 150c and earth, and a third layer (third) parallel arm resonator (RP3) 150f connected between receiving terminal 106 and earth.

With the structural example shown in FIG. 2, from the perspective of making the branching filter and therefore the SAW resonator filter more compact, the branching filter circuit strip lines 120 and 130 are respectively composed from the serial arm resonators (TxS and RxS) 120a and 130a.

In FIG. 2, the frequency adjusting LC circuit 108 comprises a capacitor component 108a and an inductor component 108b which exist between the antenna terminal 102 and the branching filter circuit 110, and therefore between the Tx-branching filter circuit strip line 120 and the Rx-branching filter circuit strip line 130. The capacitance of this capacitor component 108a is $C_{ANT}$, and the inductance of the inductor component 108b is $L_{ANT}$.

With the present invention, as shown by the structural example shown in FIG. 2, it is also acceptable to provide the serial arm resonators 120a and 130a for branching filter circuit strip lines described above and the transmission and receiving SAW filter first level serial arm resonators 140a and 150a individually.

However, to make the resonator filter more compact, it is also acceptable to combine these two transmission side serial arm resonators 120a and 140a to construct a single composite or combined resonator. Similarly, it is also acceptable to combine these two receiving side serial arm resonators 130a and 150a to construct a single composite or combined resonator. FIG. 3 shows a structural example with these serial arm resonators 120a and 140a combined into a composite resonator 142 and serial arm resonators 130a and 150a combined into a composite resonator 152. The other structural elements shown in FIG. 3 are constructed in the same manner as the structural example shown in FIG. 2.

However, with the present invention, as has already been explained, the goal is to achieve a more compact branching filter with a higher performance level by combining the transmission and receiving filters into one chip. To do this, in addition to the mechanism of the circuit structure described above, if possible, it is also necessary to have a mechanism for surface mounting of the structural elements that form the branching filter.

Figure 4A:
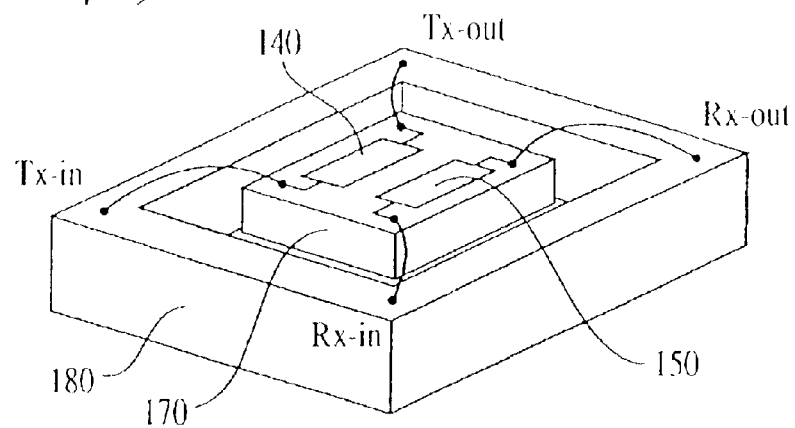
FIG. 4 (including FIGS. 4(A) through 4(C)) is a schematic oblique diagram for explaining an aspect of the branching filter using a SAW resonance type filter of the present invention.
Figure 4B:
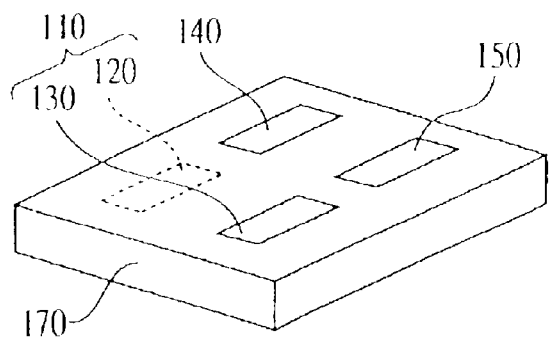
Figure 4C:
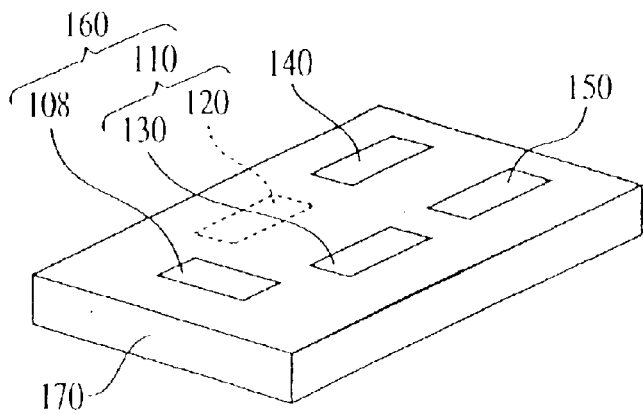

FIG. 4 (including FIGS. 4(A) through 4(C)) is a schematic perspective view that explains a structural example seen from the perspective of an aspect of the branching filter of the present invention.

FIG. 4(A) shows an example of the transmission SAW filter 140 and the receiving SAW filter 150 formed together on one piezoelectric substrate 170. Then, this piezoelectric substrate 170 is incorporated into the package on-board substrate 180. A resin substrate, low temperature sinter substrate, or aluminum substrate can be used as this on-board substrate 180. It is also possible to use a multi-layer substrate for this on-board substrate. In this case, it is possible to provide the frequency adjusting LC circuit and branching filter circuit strip line outside the piezoelectric substrate 170, one example being on-board substrate 180. In FIG. 4(A), Tx-in and Tx-out are transmission input terminals and output terminals, and Rx-in and Rx-out are receiving input terminals and output terminals. Transmission output terminal and receiving input terminal Tx-out and Rx-in are connected to the antenna terminal 102 (FIG. 1) in on-board substrate 180. On the other hand, transmission input terminal and receiving output terminal Tx-in and Rx-out correspond respectively to the transmission terminal 104 and the receiving terminal 106 shown in FIG. 1.

FIG. 4(B) shows a structural example of the transmission SAW filter 140, the receiving SAW filter 150, and the branching filter circuit 110 being formed on a single common piezoelectric substrate 170. When the Tx-branching filter circuit strip line 120 and the Rx-branching filter circuit strip line 130 are contained in the branching filter circuit strip line 110, both can be provided on this piezoelectric substrate 170. Or, when only the Tx-branching filter circuit strip line 120 is contained in the branching filter circuit strip line 110, it is acceptable to provide only this Tx-branching filter circuit strip line 120 on the piezoelectric substrate 170. Also, in FIG. 4(B), the required wiring and input terminals and output terminals are not illustrated, and the Tx-branching filter circuit strip line 120 is shown by a dotted line while the Rx-branching filter circuit strip line 130 is shown by a solid line. In this structural example, the frequency adjusting LC element 108 can be provided outside the piezoelectric substrate 170.

FIG. 4(C) shows a structural example in which the transmission SAW filter 140, the frequency characteristics adjusting LC element 108, the Rx-branching filter circuit strip line 130, and the receiving SAW filter 150 are all formed on a single common piezoelectric substrate 170. When the Tx-branching filter circuit strip line 120 is contained in the branching filter circuit strip line 110, this Tx-branching filter circuit strip line 120 can be provided on the piezoelectric substrate 170. Also, in this FIG. 4(C), required wiring and input terminals and output terminals are not illustrated, and this Tx-branching filter circuit strip line 120 is shown as a dotted line.

In this way, the transmission SAW filter 140 and the receiving SAW filter 150, or in some cases, the branching filter circuit 110 and/or the frequency adjusting LC element 108 are formed together on the piezoelectric substrate 170 (the piezoelectric substrate shown on any of FIGS. 4(A) through 4(C)), and this can be provided on the on-board substrate 180.

The Tx-branching filter circuit strip line 120 and the Rx-branching filter circuit strip line 130 formed on this piezoelectric substrate 170 are each composed from a serial arm SAW resonator. Also, the structural elements provided outside the piezoelectric substrate 170 (in the structural example in FIG. 4(A), the branching filter circuit and the frequency adjusting LC element, or in the structural example in FIG. 4(B), the frequency adjusting LC element) are provided in a package that houses the on-board substrate 180. Or, though not illustrated, the package can be formed with a multi-layer structure, and the structural elements provided outside the piezoelectric substrate 170 can be provided on the intermediate layer or the upper layer (including the package lid). By using a structure like those of the structural examples shown in FIGS. 4(A) through (C), it is possible to make branching filters more compact and give them a higher performance level.

Next, explanation will be given to an example of operation of a branching filter using a SAW resonator of the present invention. FIG. 5 is a structural diagram that shows this branching filter by individual function during a transmission operation. FIG. 6 is a structural diagram that shows this branching filter by individual function during a receive operation. FIG. 7 provides an explanation of the impedance of this branching filter.

The branching filter 100 handles transmission and receiving by one antenna 200. To do this, the transmission system and receiving system are directly connected to the antenna. Therefore, the performance of this branching filter 100 is largely related to the performance of portable telephones.

As shown in FIG. 5, when the branching filter 100 is used for transmission, transmission signals from a power amplifier 210 are sent to the transmission filter 140 via the transmission terminal 104. The frequency band of these transmission signals are restricted by the transmission filter 140, are sent to the antenna 200 via the antenna terminal 102, and transmission signals are sent from here. In this case, the receiving system 220 that contains the Rx-branching filter circuit strip line 130 and the receiving filter 150 is viewed as a load circuit together with the antenna 200.

Also, as shown in FIG. 6, when the branching filter 100 is used for receiving, signals received by the antenna 200 are sent to the receiving filter 150 via the antenna terminal 102. With the receiving filter 150, the frequency band of the received signals is restricted, and these are sent to the receiving circuit 220 via the receiving terminal 106. In this case, the transmission system 230 that includes the Tx-branching filter circuit strip line 120 and the transmission filter 140 is viewed as a load circuit together with the antenna 200.

In view of these points, the necessary conditions for a branching filter to function as a high performance branching filter are as follows.

The input impedance on the side of the Rx that includes a branching filter circuit when using the branching filter for transmission (FIG. 5) is Zr. This Zr is shown as 400 in FIG. 7. This Zr must satisfy the conditions of the following approximate expressions (1-1) and (1-2).

$$Zr*Z_{ANT}/(Zr+Z_{ANT}) \approx 50 \qquad (1\text{-}1)$$

$$Zr \approx \infty \qquad (1\text{-}2)$$

The input impedance on the side of the Tx that includes a branching filter circuit when using the branching filter for receiving (FIG. 6) is Zt. This Zt is shown as 300 in FIG. 7. This Zt must satisfy the conditions of the following approximate expressions (2-1) and (2-2).

$$Zt*Zr/(Zt+Zr) \approx 50 \qquad (2\text{-}1)$$

$$Zt \approx \infty \qquad (2\text{-}2)$$

For portable telephones, the transmission band is 890 to 915 MHz and the receiving band is 935 to 960 MHz. With the transmission filter 140 in the transmission system 230 shown in FIG. 6, it is possible to set the end frequency to the receiving band of 930 to 960 MHz using the serial arm SAW resonator of this filter, so the transmission filter 140 in this case can satisfy the input impedance approximate expression (2-1). However, for the transmission system 230, it is not possible to set the end frequency of the serial arm SAW resonator of this filter to the transmission band of 890–915 MHz. Because of this, it is not possible to satisfy the input impedance approximate expressions (1-1) and (1-2).

FIG. 8(A) is a circuit diagram showing the serial arm SAW resonator used for the branching filter of the present invention, and FIG. 8(B) is an LC equivalent circuit diagram of this resonator.

Figure 9:
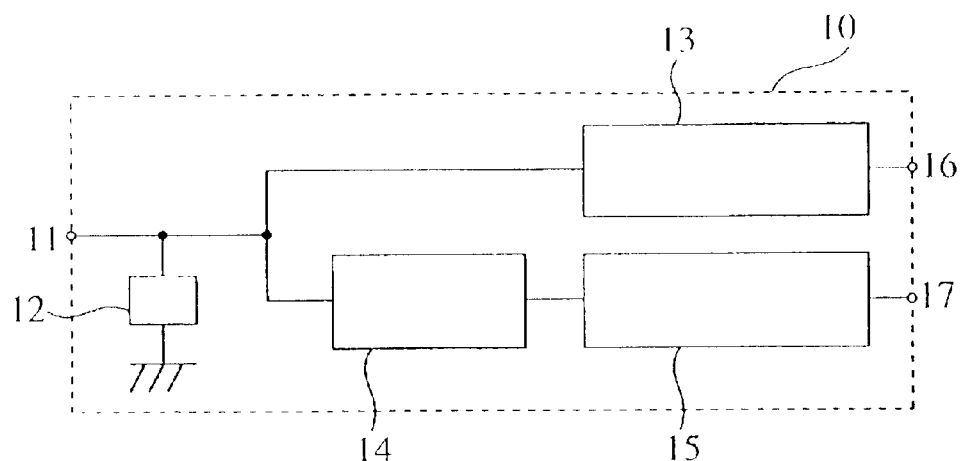
FIG. 9 is a block diagram that gives a summary explanation of a structural example of a conventional branching filter using a SAW resonance type filter.
Figure 10:
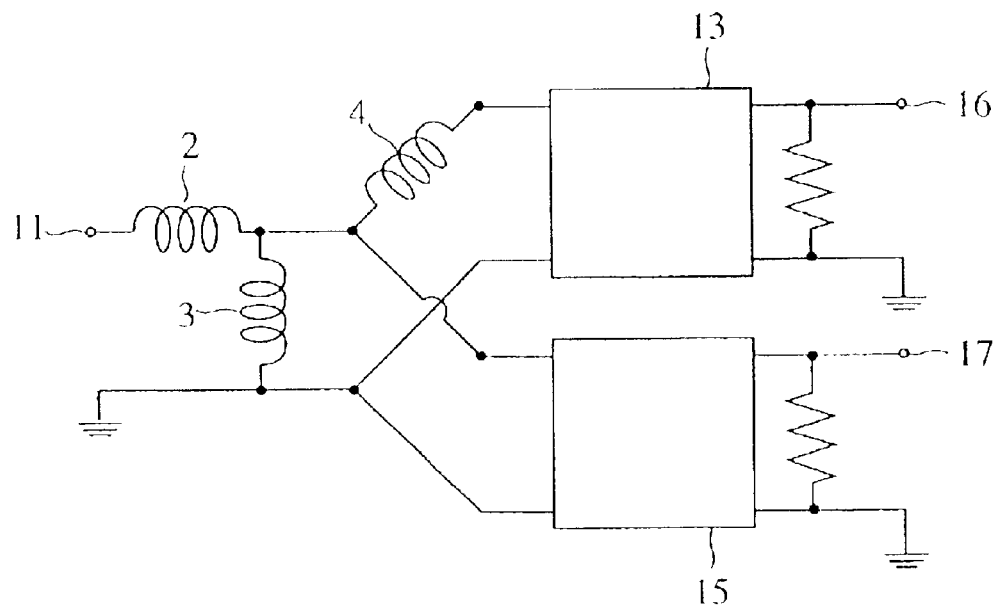
FIG. 10 is a figure that explains a specific structural example of a conventional branching filter using a SAW resonance type filter.
Figure 11:
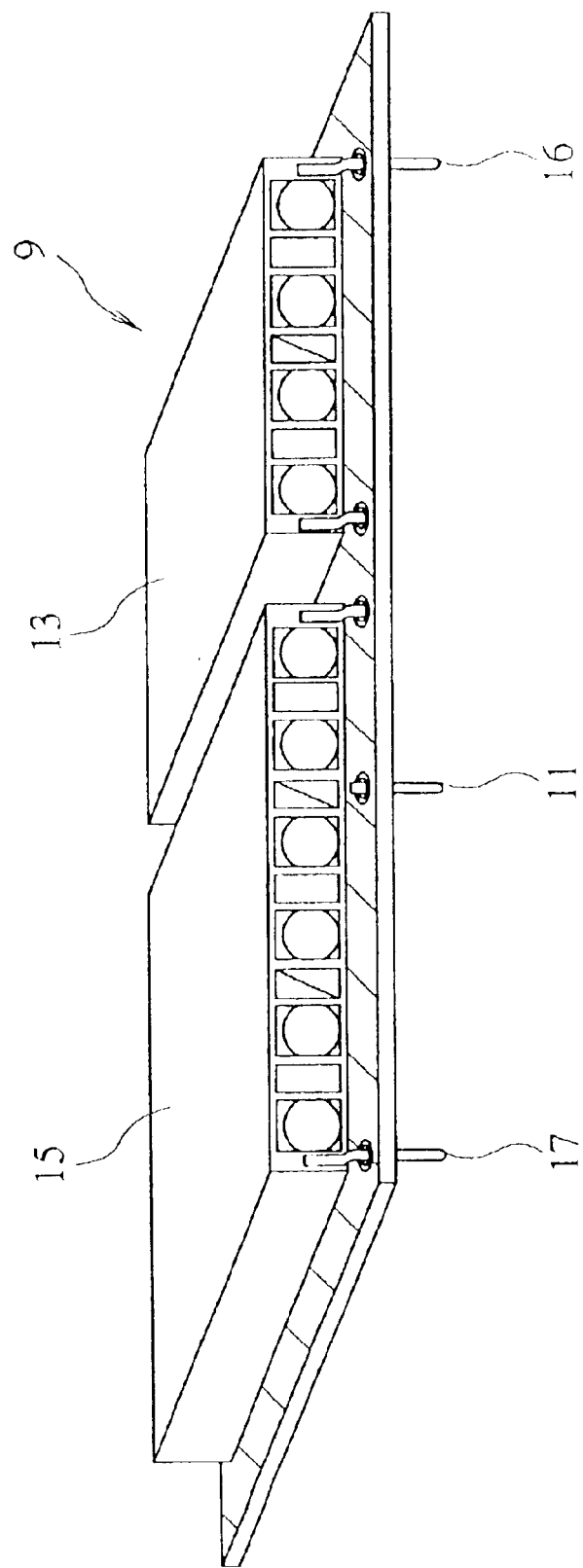
FIG. 11 is a schematic perspective view seen from the front side for explaining an aspect of a conventional branching filter using a SAW resonance type filter.
Figure 12:
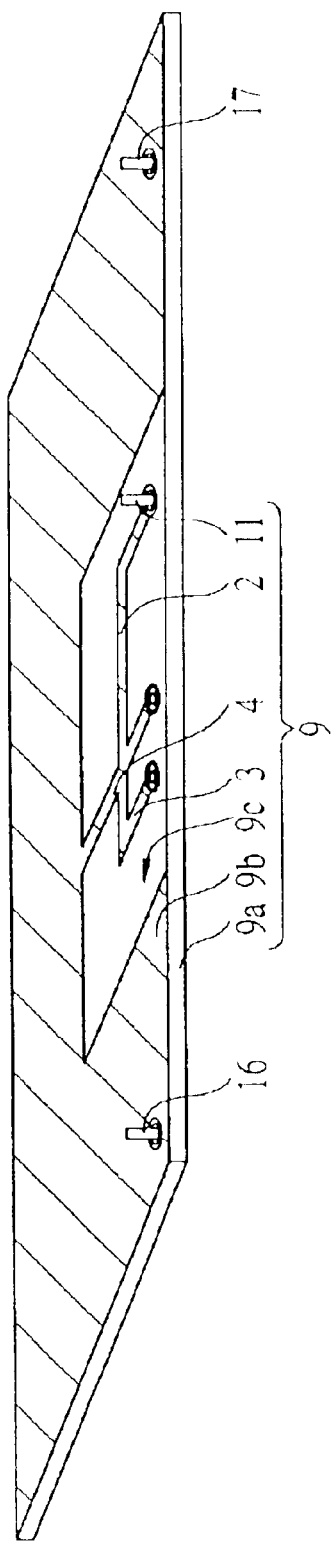
FIG. 12 is a schematic perspective view seen from the back side for explaining an aspect of a conventional branching filter using a SAW resonance type filter.
Figure 13:
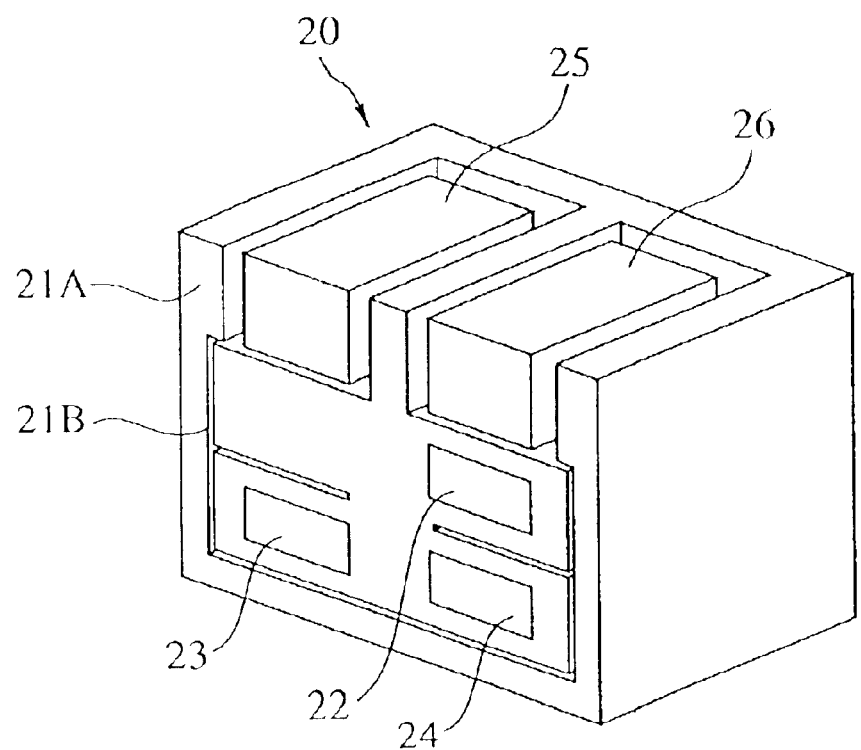
FIG. 13 is a schematic perspective view seen from the front side for explaining another aspect of a conventional branching filter using a SAW resonance type filter.

Thus, to compare the impedance characteristics during transmission for a branching filter of a conventional structure (FIG. 9) and those for the branching filter of the present invention (FIG. 5), a simulation was performed. The branching filters used as the subject of this simulation were GSM method branching filters that use a portable telephone type SAW resonator. This GSM method branching filter does not comprise the structural elements shown by 120a and inductor 108b in FIG. 2, but rather has a structure comprising the Rx-branching filter circuit strip line (for the conventional branching filter) or in place of this the serial arm SAW resonator 130a (for the branching filter of the present invention). Also, of the frequency band 890 to 960 MHz, the simulation was performed at 890, 915, 935, and 960 MHz.

The GSM method branching filter transmission filter 13 of conventional methods and transmission filter 140 of the present invention used as subjects both have the same structure as the transmission filter shown by 140 in FIG. 2. Similarly, the receiving filters 15 and 150 both have the same structure as the receiving filter shown by 150 in FIG. 2. Table 1 shows the intersection length (shown as D (μm) in table 1) and electrode logarithm (shown by M in table 1) of the SAW resonator that composes the transmission and receiving filters of these branching filters. (Please refer to the attached table 1.) In table 1, the SAW resonators 140a, 140b, 140c, and 140d that compose the transmission filter 140 shown in FIG. 2 are shown as TS1, TS2, TS3, and TS4. Also, the serial arm SAW resonators 150a, 150b, and 150c that compose the receiving filter 150 in FIG. 2 are shown as RS1, RS2, and RS3. Also, parallel arm SAW resonators 150d, 150e, and 150f are shown as RP1, RP2, and RP3. Furthermore, with the branching filter of the present invention used as a subject for simulation, the Rx-branching filter circuit strip line 130 (FIG. 1) has been substituted by the serial arm SAW resonator 130a, so this serial arm SAW resonator 130a is shown as RxS. Note that the Tx-branching filter circuit strip line 120 and the serial arm SAW resonator 120a that should be substituted for this (shown as TxS in FIG. 2) have been omitted.

Furthermore, for the conventional branching filter (shown as 10 in FIG. 9) that is the subject of simulation, the transmission filter 13 is incorporated into a single piezoelectric substrate, receiving filter 15 is incorporated into another single piezoelectric substrate, and the Rx-branching filter circuit strip line 14 and the LC chip 12 are provided on a multi-layer substrate (on-board substrate) for which these transmission and receiving filters 13 and 15 are incorporated on the above-mentioned piezoelectric substrates.

Table 2 shows branching filter circuit impedance values for the desired parameters and obtained simulation results for the specific type of branching filter circuit. In Table 2, code items I and II indicate a branching filter of a conventional structure. Code items III, IV, and V indicate a branching filter of the present invention. (Please refer to the attached Table 2.)

In this Table 2, with the conventional branching filter 1, the structure is such that the branching filter circuit is the strip line, only the Rx-branching filter circuit strip line (strip line length (LR)=40 mm) (shown as 14 in FIG. 9) is provided, without providing the Tx-branching filter circuit strip line (strip line length (LT)=0 mm), and there is also no frequency adjusting LC chip (shown as 12 in FIG. 9) provided. Therefore, the input terminal of the transmission filter 13 and the input terminal of the Rx-branching filter circuit strip line 14 are directly connected to the antenna terminal 11.

Also, with the conventional branching filter II, the structure is such that the branching filter circuit is the strip line, neither the Tx-branching filter circuit strip line nor the Rx-branching filter circuit strip line is provided (strip line length (LT, LR)=0 mm), and there is also no frequency adjusting LC chip (shown as 12 in FIG. 9) provided. Also, the input terminals of the transmission filter 13 and the receiving filter 15 are directly connected to the antenna terminal 11.

The three types of branching filter of the present invention III, IV, and V that are subjects of simulation are not provided with a Tx-branching filter circuit strip line 120 or a serial arm SAW resonator (TxS) 120a (FIG. 2) in the circuit structure shown in FIG. 1. Therefore, the input terminal of the transmission filter 140 is directly connected to the frequency adjusting LC element 108. Furthermore, these branching filters III, IV, and V have a structure with which instead of providing the Rx-branching filter circuit 130, the serial arm SAW resonator (RxS) 130a is provided. Then, as has already been explained in reference to FIGS. 2 and 3, these branching filters III, IV, and V are structured with the serial arm SAW resonator 130a, and the first level serial arm SAW resonator 150a of the receiving filter 150 combined as a composite resonator 152. Based on such conditions, the branching filter III comprises capacitor component $C_{ANT}$ 4(capacitance=10 pF) and inductor $L_{ANT}$ (inductance=7 nH) as the externally mounted frequency adjusting LC element 108. Also, the branching filter IV comprises not capacitor component $C_{ANT}$ but only inductor $L_{ANT}$ (inductance=7 nH) as the externally mounted frequency adjusting LC element 108. Similarly, the branching filter V comprises not capacitor component $C_{ANT}$ but only inductor $L_{ANT}$ (inductance=10 nH) as the externally mounted frequency adjusting LC element 108. In this way, the branching filter of the present invention is structured with the goal of improving frequency characteristics using the frequency characteristics adjusting LC element 108. Impedance values for 890, 915, 935, and 960 MHz are shown for the transmission and receiving filters of the conventional technology and the present invention.

Of the conventional branching filters and that of the present invention, Table 3 shows real number and imaginary number values for input impedance Zt 300 of the transmission filter 140 and input impedance Zr 400 of the receiving filter 150 as shown in FIG. 7 for specified branching filters, specifically branching filters II (conventional) and IV (the present invention) of Table 2. Then, input impedance values for 890, 900, 915, 935, and 960 MHz are shown for the transmission and receiving filters. (Please refer to the attached Table 3.)

By comparing input impedance Zt and Zr of branching filters II and IV in Table 3, it became clear that the receiving filter transmission band impedance is large for the branching filter of the present invention. Looking specifically, for the receiving filter of Table 1, when frequency f is 890 MHz, the input impedance Zr for branching filter II has a real number of 0.0127 and an imaginary number of −1.098. In comparison, the input impedance Zr for branching filter IV has a real number value of 3.54 and an imaginary number value of 23.20. In this way, the input impedance of the branching filter of the present invention is significantly larger than that of the conventional branching filter. Thus, with the branching filter of the present invention, we can see that there is a significant improvement in frequency characteristics. This improvement is also clear from the impedance characteristics results shown in Table 2.

Also, from the impedance characteristics results of table 2, we can see that the transmission frequency band is 890 to 915 MHz and the receiving frequency band is 935 to 960 MHz.

As has already been explained, the branching filter of the present invention which was provided for the above-mentioned impedance characteristics simulation has a structure made more compact by including a receiving filter first level serial arm SAW resonator in the Rx-branching filter circuit strip line. Here, we will explain the input impedance at f=900 MHz which is the central frequency of the transmission band which is of the most interest in terms of portable telephone quality.

When we see the transmission filter side from the point C 500 shown in FIG. 7, the combined impedance $Z_{IN}$ (Tr) is given by the following equation (3).

$$Z_{IN}(Tr)=Zt*Zr/(Zt+Zr) \quad (3)$$

In this case, the input impedance of the transmission filter 140 and the receiving filter 150 at f=900 MHz is as follows based on Table 3.

$$Zt(900)=0.863-j0.626 \quad (4)$$

$$Zr(900)=0.0175-j0.934 \quad (5)$$

Therefore, impedance $Z_{IN}$ (Tr) (900) on the transmission filter side from the point C 500 shown in FIG. 7 is given by the following equation (6).

$$Z_{IN}(Tr)(900)=0.2409-j0.501 \quad (6)$$

If this $Z_{IN}$ (Tr) (900) undergoes impedance correction only by the inductance $L_{ANT}$ 108b of the frequency adjusting LC element 108 in the structural example shown in FIG. 2 for the present invention, then the value of the inductance $L_{ANT}$ is as follows.

$$L_{ANT}=4.4(nH) \quad (7)$$

In this case, when the characteristics impedance is not the desired value, an impedance matching circuit must be introduced.

In reality, with this type of portable telephone, the optimum characteristics are demanded not only for frequency f=900 MHz but for the transmission band (890 to 915 MHz). These optimum characteristics are normally determined using simulation. The branching filters IV and V shown in Table 2 show the results of adjusting impedance for transmission band 890 to 915 MHz using only the inductor $L_{ANT}$ 108b. Also, the branching filter III shown in Table 2 shows the results of adjusting impedance for the same kind of transmission band using the inductor $L_{ANT}$ 108b and the capacitor $C_{ANT}$ 108a. One combination of these inductor $L_{ANT}$ and capacitor $C_{ANT}$ values is $L_{ANT}$=7.0 nH and $C_{ANT}$=10.0 pF.

In this way, as is clear from the results shown in Table 2, with the structure of the branching filter of the present invention, by incorporating the transmission filter 140 and the receiving filter 150 on a single common piezoelectric substrate and by providing an externally mounted frequency adjusting LC circuit 108, it became clear that it is possible to improve frequency characteristics, particularly passband characteristics.

From the results of Table 3, it can be found that the impedance for the transmission band of the receiving filter 150 is large using the branching filter circuit strip line serial arm SAW resonator 130a. This improvement in frequency characteristics depends on the impedance seen on the filter side from the point C 500 shown in FIG. 7. Specifically, it is assumed that this is caused by introducing the branching filter circuit strip line serial arm SAW resonator 130a (RxS) on the input terminal of the receiving filter 150. Inconsistencies in impedance values due to the introduction of this branching filter circuit strip line serial arm SAW resonator 130 a (RxS) are adjusted with an externally mounted frequency adjusting LC element 108. This frequency adjusting LC element is made into chip form, and by providing this LC chip on the on and receiving filter package on-board substrate or by providing it on a piezoelectric substrate on which is created a transmission and receiving filter, it is possible to make a branching filter comprising a SAW resonator generally more compact and higher in performance.

It will be clear to those in the industry that it is possible to make many changes and variations of the present invention without straying from the main point of the present invention and without being restricted by the preferred embodiments described above.

TABLE 1

| TRANSMISSION | | TS1 | | TS2 | | TS3 | | TS4 | |
|---|---|---|---|---|---|---|---|---|---|
| FILTER | | D (μm) | M | D (μm) | M | D (μm) | M | D (μm) | M |
| | | 85 | 90 | 42.5 | 90 | 84 | 86 | 60 | 60 |
| RECEIVING | SERIAL | RxS | | RS1 | | RS2 | | RS3 | |
| FILTER | ARM | D (μm) | M | D (μm) | M | D (μm) | M | D (μm) | M |
| | | 124 | 90 | 124 | 90 | 62 | 90 | 62 | 90 |
| | PARALLEL | | | RP1 | | RP2 | | RP3 | |
| | ARM | | | D (μm) | M | D (μm) | M | D (μm) | M |
| | | | | 102 | 120 | 102 | 120 | 76 | 80 |

TABLE 2

| | BRANCHING FILTER CIRCUIT FREQUENCY ADJUSTING LC ELEMENT | | TRANSMISSION FILTER | | | | RECEIVING FILTER | | | |
|---|---|---|---|---|---|---|---|---|---|---|
| I | LT = 0 (mm) | LR = 40 (mm) | 1.22 | 1.17 | 35.7 | 36.8 | 31.6 | 58.5 | 3.11 | 3.04 |
| II | LT = 0 (mm) | LR = 0 (mm) | 3.56 | 3.21 | 37.9 | 28.6 | 33.0 | 55.6 | 3.11 | 2.32 |
| III | $LT_{ANT}$ = 7 (nH) | $C_{ANT}$ = 7 (pF) | 1.28 | 1.28 | 36.6 | 35.0 | 34.1 | 59.0 | 3.28 | 3.20 |
| IV | $LT_{ANT}$ = 7 (nH) | | 1.30 | 1.32 | 34.7 | 33.2 | 35.1 | 58.5 | 3.74 | 4.0 |
| V | $LT_{ANT}$ = 10 (nH) | | 1.37 | 1.08 | 36.1 | 29.2 | 35.5 | 54.7 | 3.10 | 3.70 |

TABLE 3

| | | TRANSMISSION FILTER | | | | | RECEIVING FILTER | | | | |
|---|---|---|---|---|---|---|---|---|---|---|---|
| | FREQUENCY (MHz) | 890 | 900 | 915 | 935 | 960 | 890 | 900 | 915 | 935 | 960 |
| II | REAL NUMBER | 1.283 | 0.8627 | 1.345 | 2.313 | 0.0831 | 0.0127 | 0.0175 | 0.0320 | 0.606 | 0.7414 |
| | IMAGINARY NUMBER | −0.816 | −0.6256 | 0.5287 | 0.8715 | −4.017 | −1.098 | −0.934 | −0.654 | −0.017 | 1.263 |
| IV | REAL NUMBER | 1.283 | 0.8627 | 1.345 | 2.313 | 0.0831 | 3.540 | 4.7507 | 0.435 | 0.875 | 0.2421 |
| | IMAGINARY NUMBER | −0.816 | −0.6256 | 0.5287 | 0.8715 | −4.017 | 23.20 | | | 0.0479 | 1.150 |

What is claimed is:

1. A surface acoustic wave duplexer having an antenna terminal, a transmitting terminal and a receiving terminal, comprising:
   a transmitting SAW filter coupled between the antenna terminal and the transmitting terminal;
   a receiving SAW filter coupled between the antenna terminal and the receiving terminal:
   a common piezoelectric substrate on which both of the transmitting SAW filter and the receiving SAW filter are formed; and
   a package covering the common piezoelectric substrate, wherein the antenna terminal, the transmitting terminal and the receiving terminal are formed on the package;
   a frequency adjusting circuit being coupled between the antenna terminal and the transmitting SAW filter or the receiving SAW filter, wherein the frequency adjusting circuit has a capacitance element; and
   a branching filter circuit coupled between the frequency adjusting circuit and the transmitting SAW filter or the receiving SAW filter, wherein the branching filter circuit is formed on the package.

2. A surface acoustic wave duplexer according to claim 1, wherein the package has a first layer substrate and a second layer substrate, the first layer substrate is disposed on the second layer substrate, and the branching filter circuit is formed on the first layer substrate or the second layer substrate of the package.

3. A surface acoustic wave duplexer according to claim 1, wherein the frequency adjusting circuit has an inductance element.

4. A surface acoustic wave duplexer according to claim 1, wherein the frequency adjusting circuit is formed on the package.

5. A surface acoustic wave duplexer according to claim 1, wherein the capacitance element is coupled in series between the antenna terminal and the transmitting SAW filter or the receiving SAW filter.

6. A surface acoustic wave duplexer according to claim 1, wherein the branching filter circuit comprises a serial arm resonator.

7. A surface acoustic wave duplexer according to claim 1, wherein the package has a multi-layer structure.

8. A surface acoustic wave duplexer having an antenna terminal, a transmitting terminal and a receiving terminal, comprising:
   a SAW filter chip including a transmitting SAW filter connected with the transmitting terminal and a receiving SAW filter connected with the receiving terminal, wherein both the transmitting SAW filter and the receiving SAW filter are formed on one common piezoelectric substrate;
   a package covering the one common piezoelectric substrate, wherein the antenna terminal, the transmitting terminal and the receiving terminal are formed on the package; and
   a frequency adjusting circuit being coupled between the antenna terminal and the transmitting SAW filter or the receiving SAW filter, wherein the frequency adjusting circuit has a capacitance element; and
   a branching filter circuit being coupled between the frequency adjusting circuit and the transmitting SAW filter or the receiving SAW filter, wherein the branching filter circuit is formed on the package.

9. A surface acoustic wave duplexer according to claim 8, wherein the package has a first layer substrate and a second layer substrate, the first layer substrate being disposed on the second layer substrate, and the branching filter circuit is formed on the first layer substrate or the second layer substrate.

10. A surface acoustic wave duplexer according to claim 8, wherein the frequency adjusting circuit has an inductance element.

11. A surface acoustic wave duplexer according to claim 8, wherein the capacitance element is coupled in series between the antenna terminal and the transmitting SAW filter or the receiving SAW filter.

12. A surface acoustic wave duplexer according to claim 8, wherein the branching filter circuit comprises a serial arm resonator.

13. A surface acoustic wave duplexer according to claim 8, wherein the package has a multi-layer structure.

* * * * *